(12) United States Patent
Ma et al.

(10) Patent No.: US 10,490,603 B2
(45) Date of Patent: Nov. 26, 2019

(54) DISPLAY DEVICE

(71) Applicant: Japan Display Inc., Minato-ku (JP)

(72) Inventors: Chunche Ma, Minato-ku (JP); Hajime Akimoto, Minato-ku (JP); Masakazu Gunji, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/943,826

(22) Filed: Apr. 3, 2018

(65) Prior Publication Data

US 2018/0301519 A1 Oct. 18, 2018

(30) Foreign Application Priority Data

Apr. 13, 2017 (JP) .................. 2017-080079

(51) Int. Cl.
*H01L 27/32* (2006.01)
*H01L 51/52* (2006.01)
*H01L 51/50* (2006.01)

(52) U.S. Cl.
CPC ...... *H01L 27/3211* (2013.01); *H01L 27/3246* (2013.01); *H01L 27/3248* (2013.01); *H01L 27/3258* (2013.01); *H01L 51/5088* (2013.01); *H01L 51/5203* (2013.01); *H01L 51/5215* (2013.01)

(58) Field of Classification Search
CPC ............. H01L 27/3211; H01L 51/5088; H01L 51/5203

USPC .......................................................... 257/40
See application file for complete search history.

(56) References Cited

U.S. PATENT DOCUMENTS

| | | | |
|---|---|---|---|
| 2013/0285538 A1* | 10/2013 | Cho | ..................... H01L 51/0004 313/504 |
| 2015/0069361 A1* | 3/2015 | Sato | ..................... H01L 27/3279 257/40 |
| 2016/0204187 A1 | 7/2016 | Sato et al. | |
| 2016/0284776 A1* | 9/2016 | Kim | ..................... H01L 27/3258 |
| 2016/0322436 A1* | 11/2016 | Jung | ..................... H01L 27/3246 |

FOREIGN PATENT DOCUMENTS

JP 2015-53214 3/2015

* cited by examiner

*Primary Examiner* — Karen Kusumakar
*Assistant Examiner* — Adam S Bowen
(74) *Attorney, Agent, or Firm* — Oblon, McClelland, Maier & Neustadt, L.L.P.

(57) ABSTRACT

A display device may include an insulation layer having openings, the insulation layer having opening edges around the respective openings; pixel electrodes in the respective openings and on the respective opening edges; an electroluminescence layer continuously on the pixel electrodes, the electroluminescence layer consisting of some layers including a bottom layer thereof, the electroluminescence layer including a light emitting layer in one of the layers except for at least the bottom layer, the light emitting layer overlapping with a corresponding one of the pixel electrodes; and a counter electrode on the electroluminescence layer.

14 Claims, 12 Drawing Sheets

FIG.2
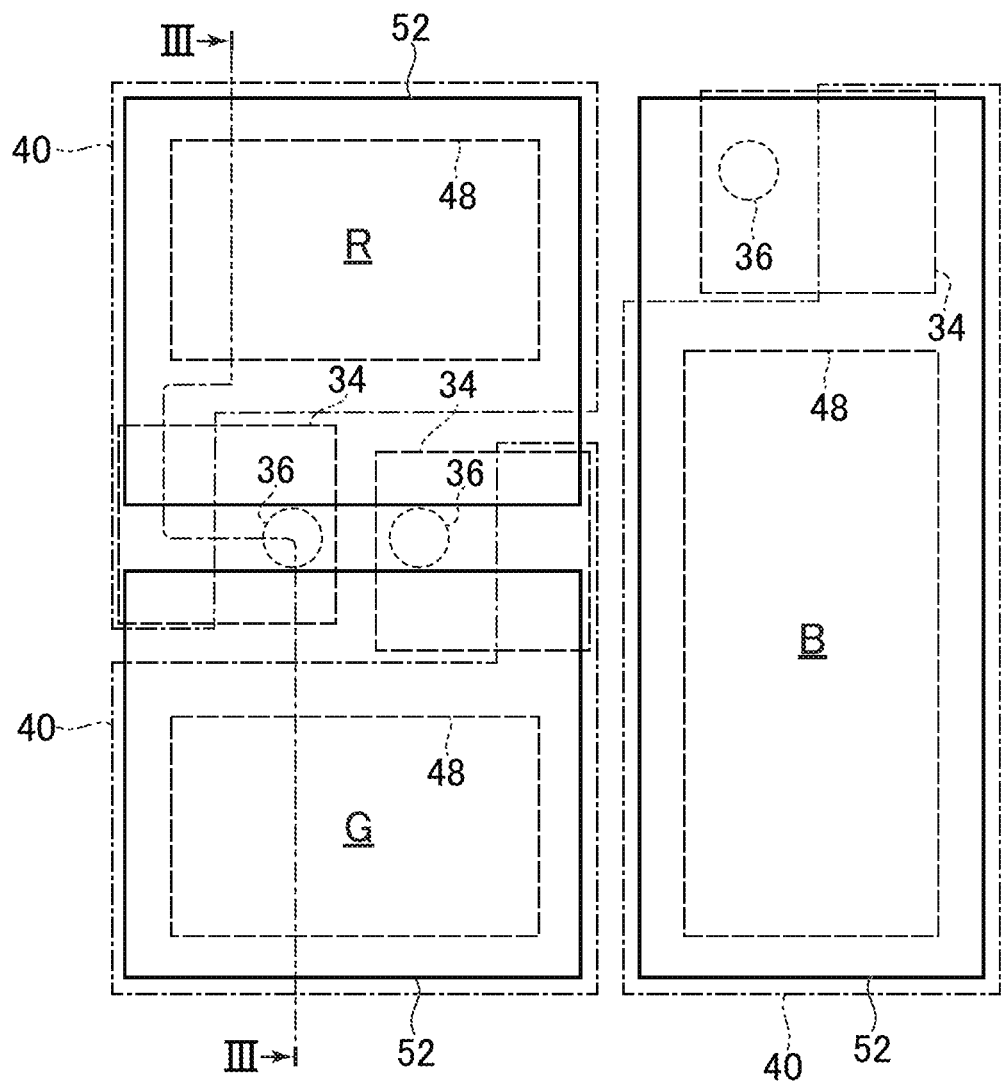
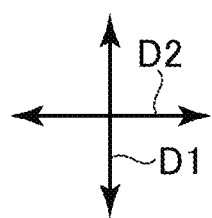

FIG.10
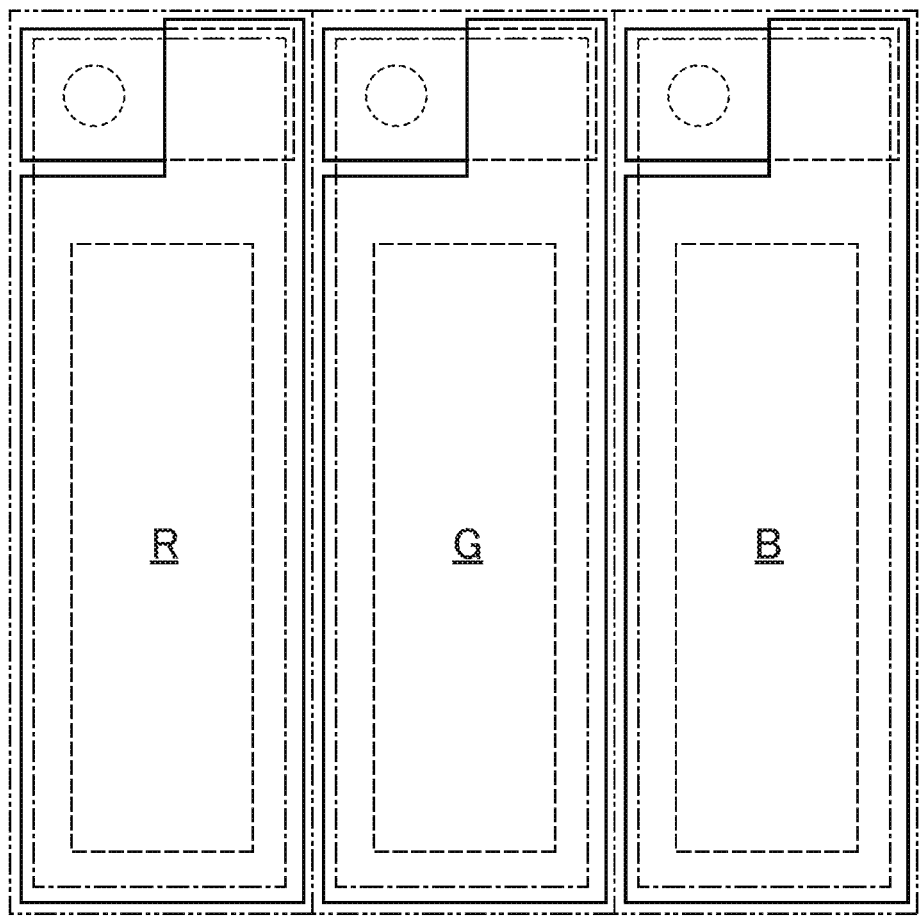
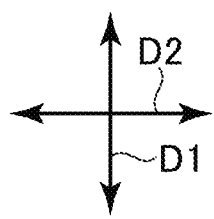

FIG.11
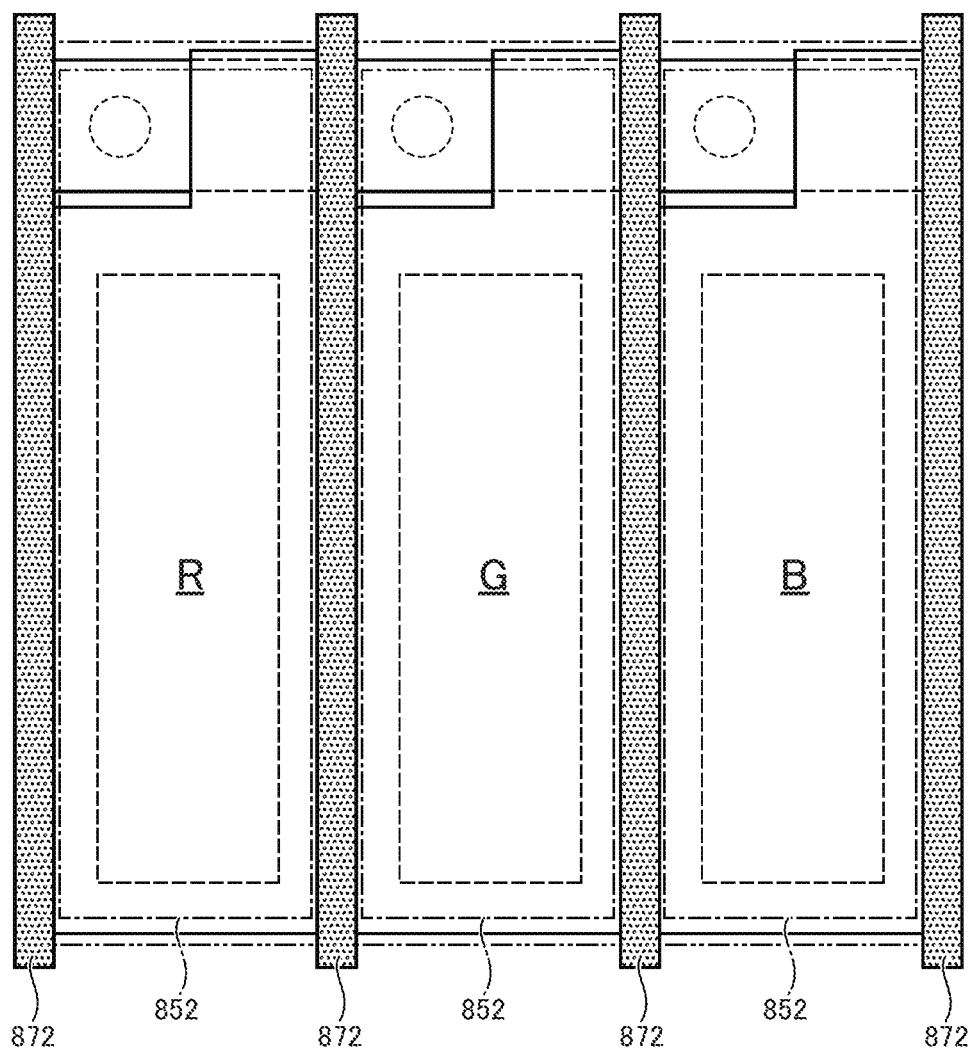
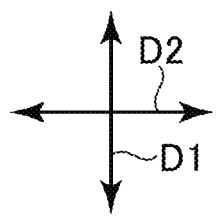

DISPLAY DEVICE

CROSS-REFERENCE TO RELATED APPLICATION

The present application claims priority from Japanese application JP2017-080079 filed on Apr. 13, 2017, the content of which is hereby incorporated by reference into this application.

BACKGROUND OF THE INVENTION

1. Field of the Invention

This relates to display devices.

2. Description of the Related Art

An organic electroluminescence display device has an organic film, with a light emitting layer, between a pixel electrode (e.g. anode) and a counter electrode (e.g. cathode). Due to thinness of the ordinary organic film, an insulation layer, called a bank, sits between adjacent pixel electrodes and on a periphery of each pixel electrode. This prevents the organic film from being broken by step and prevents the pixel electrode and the counter electrode from being connected. The light emitting layer emits no light in an area overlapping with the bank, where the light emitting layer is insulated. The area is a non-light-emitting region.

Recently, pixels have got closer to one another because of their increase in number, leading to current leakage through a continuous organic film and light emission in adjacent pixels. JP 2015-53214A discloses providing the organic film with low conductivity above an area between adjacent pixel electrodes, whereby preventing the electric leakage.

Higher image quality preferably requires a smaller non-light-emitting region (higher aperture ratio), whereas JP 2015-53214A fails to disclose means therefor. A larger non-light-emitting region (lower aperture ratio) leads to lower brightness or necessitates high current drive, which raises a problem of short lifetime.

SUMMARY OF THE INVENTION

This aims to make the non-light-emitting region smaller (aperture ratio higher).

A display device may include an insulation layer having a plurality of openings, the insulation layer having a plurality of opening edges around the respective openings; a plurality of pixel electrodes in the respective openings and on the respective opening edges; an electroluminescence layer continuously on the plurality of pixel electrodes, the electroluminescence layer consisting of some layers including a bottom layer thereof, the electroluminescence layer including a light emitting layer in one of the layers except for at least the bottom layer, the light emitting layer overlapping with a corresponding one of the pixel electrodes; and a counter electrode on the electroluminescence layer.

The pixel electrodes are on the insulation layer, making a non-light emitting region smaller (making an aperture ratio larger).

BRIEF DESCRIPTION OF THE DRAWINGS

FIG. 2 is an enlarged view of a portion of II-II line cross section of the display device in FIG. 1.

FIG. 10 is an enlarged plan view of a portion of a display device in accordance with a seventh embodiment.

FIG. 11 is an enlarged plan view of a portion of a display device in accordance with an eighth embodiment.

DETAILED DESCRIPTION OF THE INVENTION

Figure 1:
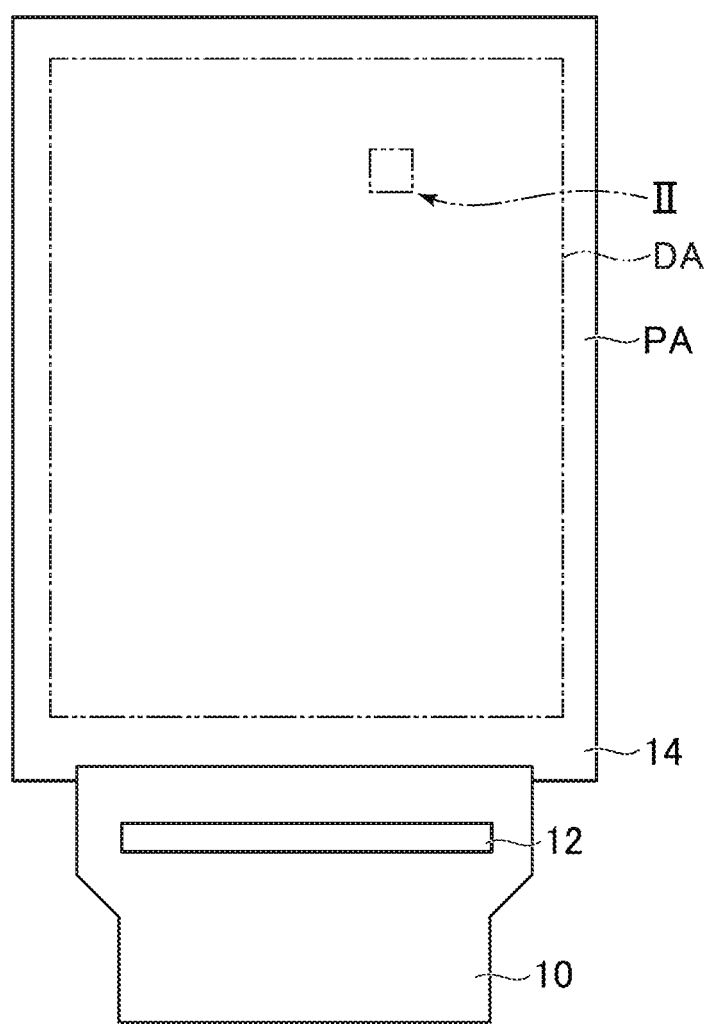
FIG. 1 is a plan view of a display device in accordance with a first embodiment.

Hereinafter, embodiments will be described with reference to the drawings. Here, the invention can be embodied according to various aspects within the scope of the invention without departing from the gist of the invention and is not construed as being limited to content described in the embodiments exemplified below.

The drawings are further schematically illustrated in widths, thickness, shapes, and the like of units than actual forms to further clarify description in some cases, but are merely examples and do not limit interpretation of the invention. In the present specification and the drawings, the same reference numerals are given to elements having the same functions described in the previously described drawings and the repeated description will be omitted.

Further, in the detailed description, "on" or "under" in definition of positional relations of certain constituents and other constituents includes not only a case in which a constituent is located just on or just under a certain constituent but also a case in which another constituent is interposed between constituents unless otherwise mentioned.

First Embodiment

FIG. 1 is a plan view of a display device in accordance with a first embodiment. The display device is an organic electroluminescence display device. The display device is configured to display a full-color image in full-color pixels, each of which consists of combination of unit pixels (subpixels) of colors such as red, green, and blue. The display device includes a display area DA on a substrate 14 and a peripheral area PA around the display area DA. The peripheral area PA is outside the display area DA. A flexible printed circuit board 10 is connected to the peripheral area PA on the substrate 14. On the flexible printed circuit board 10 is mounted an integrated circuit chip 12 for driving elements to display the image. The integrated circuit chip 12 may be alternatively mounted on the substrate 14.

FIG. 2 is an enlarged view of a portion of II-II line cross section of the display device in FIG. 1. In this example, the full color pixel consists of a red subpixel R, a green subpixel G, and a blue subpixel B. The blue subpixel B has a larger light emitting area than the red and green subpixels R, G, due to its low photopic luminous efficiency function. Specifically, the red and green subpixels R, G are arranged in a first direction D1 (longitudinal direction in FIG. 2), whereas the blue subpixel B is next to the red and green subpixels R, G in a second direction D2 (lateral direction in FIG. 2) perpendicular to the first direction D1.

Figure 3:
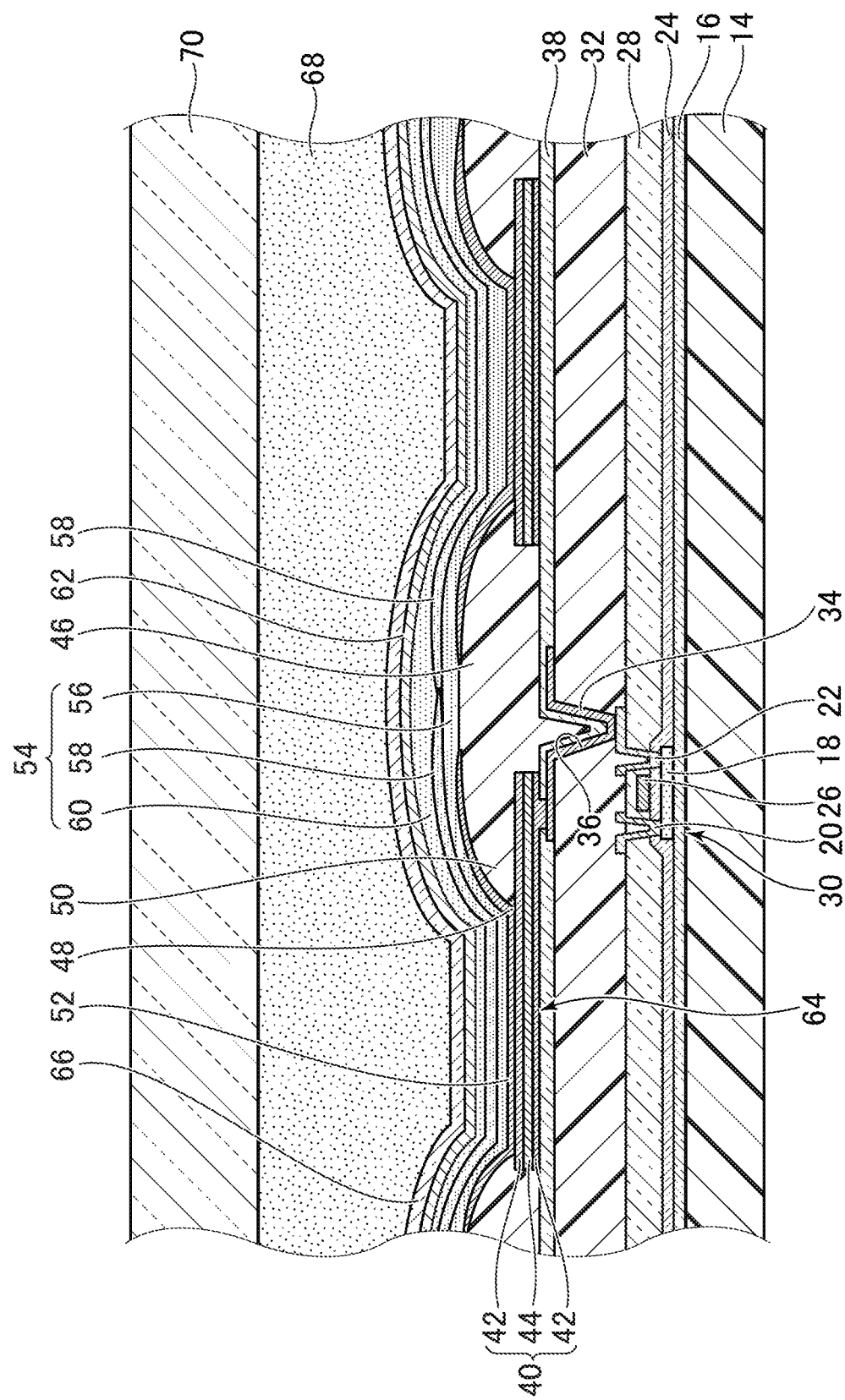
FIG. 3 is an enlarged view of line cross section of the display device in FIG. 2.

FIG. 3 is an enlarged view of line cross section of the display device in FIG. 2. The substrate 14 may be formed from polyimide resin or polyethylene terephthalate, having flexibility. The substrate 14 has an underlying insulation film 16 formed thereon for a barrier against impurities contained therein. The underlying insulation film 16 may be a silicone oxide film or a silicon nitride film or may be a laminate structure thereof.

On the underlying insulation film 16 is a semiconductor layer 18. The semiconductor layer 18 is electrically connected to a source electrode 20 and a drain electrode 22. The semiconductor layer 18 is covered with a gate insulation layer 24. On the gate insulation layer 24 is a gate electrode 26, which is covered with an interlayer dielectric 28. The source electrode 20 and the drain electrode 22 penetrate the gate insulation layer 24 and the interlayer dielectric 26. The semiconductor layer 18, the source electrode 20, the drain electrode 22, the gate electrode 26, and the gate insulation layer 24 constitute at least part of a thin film transistor 30. The thin film transistor 30 is in a display area DA. The thin film transistor 30 is covered with a planarization film 32. The planarization film 32 is made from an organic material such as a polyimide resin or a photosensitive acrylic resin.

On the planarization film 32 are a plurality of connection electrodes 34 for the respective unit pixels (subpixels). The connection electrode 34 is made of a transparent conductive film such as indium tin oxide (ITO) and is electrically connected to one of the source electrode 20 and drain electrode 22 on the interlayer dielectric 28 through a contact hole 36 penetrating the planarization film 32.

As shown in FIG. 2, the connection electrodes 34, of the red and green subpixels R, G arranged in the first direction D1, are arranged in the second direction D2, extending from the respective contact holes 36 and in respective directions opposite to each other. The planarization film 32 and the connection electrode 34 are covered with an inorganic insulation film 38, which may be made from SiN.

On the inorganic insulation film 38 are a plurality of underlying electrodes 40. Each underlying electrode 40 consists of some layers including a transparent conductive layer 42, which may be made from indium tin oxide (ITO), in a top layer and in a bottom layer. The layers further include a light reflective layer 44 in an interlayer. The transparent conductive layer 42 in the bottom layer is connected to the connection electrode 34 through a penetrating hole in the inorganic insulation film 38.

The drain electrode 22 and the underlying electrode 40, which are herein connected through the connection electrode 34, may be alternatively connected directly to each other, with the planarization film 32 and the inorganic insulation film 38 having respective openings at the same position above the drain electrode 22.

On the underlying electrodes 40 is an insulation layer 46, which may be made from a polyimide resin or an acrylic resin. The insulation layer 46 has a plurality of openings 48. The insulation layer 46 is on a periphery of each underlying electrode 40. The underlying electrode 40 has a portion (e.g., central portion) exposed from the insulation layer 46 in the opening 48. As shown in FIG. 2, the opening 48 for the subpixel B with lower brightness is larger than the opening 48 for each of the red and green subpixels R, G. The insulation layer 46 has a plurality of opening edges 50 around the respective openings 48. The insulation layer 46 constitutes a bank around a portion of each underlying electrode 40.

A plurality of pixel electrodes 52 are laminated on the respective underlying electrodes 40. The pixel electrode 52 (e.g., anode) is in the opening 48 of the insulation layer 46 extending to the opening edge 50 thereof; that is, the pixel electrode 52 is larger than the opening 48 of the insulation layer 46 in a plan view. The opening edge 50 of the insulation layer 46 is interposed between a periphery of the underlying electrode 40 and a periphery of the pixel electrode 52. The pixel electrode 52 is connected to the underlying electrode 40 in the opening 48 and is on the insulation layer 46. The pixel electrode 52 at its surface has a transparent conductive film such as indium tin oxide (ITO).

In accordance with this embodiment, the pixel electrode is on the insulation layer 46, making the light emitting region larger, or making the non-light emitting region smaller (making the aperture ratio greater). The underlying electrode 40 is thicker than the pixel electrode 52. A level difference between the pixel electrode 52 and the insulation layer 46 thereunder is smaller than a level difference between the underlying electrode 40 and the inorganic insulation film 38 thereunder. The pixel electrode 52 has its periphery thinner at a position closer to its edge, making the level difference further smaller. In this example, the pixel electrode 52 includes no light reflective layer.

On the plurality of pixel electrodes 52 is an organic electroluminescence layer 54. The organic electroluminescence layer 54 may be continuously on the plurality of pixel electrodes 52. As mentioned above, since the level difference between the pixel electrode 52 and the insulation layer 46 thereunder is relatively small, the organic electroluminescence layer 54 can be continuously formed without a break by vapor deposition or sputtering.

The organic electroluminescence layer 54 consists of some layers including a light emitting layer 58. The organic electroluminescence layer 54 includes a first carrier injection transport layer 56 between the light emitting layer and the pixel electrode 52 and continuously on the plurality of pixel electrodes 52. In a case where the pixel electrode 52 is an anode, the first carrier injection transport layer 56 may be a hole injection layer or a hole injection layer with a transport layer.

The organic electroluminescence layer 54, at a position except for at least a bottom layer thereof, includes emitting layers 58 overlapping with the respective pixel electrodes 52. The light emitting layers 58 are separated from one another for the respective pixel electrodes 52. The light emitting layers 58 are individually disposed for the respective pixel electrode 52 to emit light in red, green, or blue in the respective pixels. The color of each pixel is not limited thereto and may be yellow or white.

The light emitting layer 58 protrudes from a periphery of the corresponding pixel electrode 52; that is, the light emitting layer 58 covers a whole top surface of the corresponding pixel electrode 52 and a side edge surface of it as well. Therefore, the pixel electrode 52 over at least the whole top surface thereof can be a light emitting region. An adjacent pair of the light emitting layer 58 overlap with each other at their end portions. The light emitting layers 58, for example, for the subpixels R, G, B in red, green, and blue, overlap with one another at their end portions. Alternatively, an adjacent pair of the light emitting layers 58 may be in contact with each other without overlap of their end portions or may have their end portions spaced from each other.

The organic electroluminescence layer 54 has a second carrier injection transport layer 60 between the light emitting layer 58 and the counter electrode 58. In a case where the counter electrode 62 is a cathode, the second carrier injection transport layer 60 is an electron injection layer or an electron injection layer with an electron transport layer. Among some layers constituting the organic electroluminescence layer 54, except for the light emitting layers 58, other layers (the first carrier injection transport layer 56 and the second carrier injection transport layer 60) are formed to entirely cover the display area DA (FIG. 1) and to extend over the plurality of pixels. The organic electroluminescence layer 54 is continuous over the insulation layer 46.

On the organic electroluminescence layer 54 is a counter electrode 62 (e.g., a cathode). Opposed to the plurality of pixel electrodes 52 is one continuous counter electrode 62. The counter electrode 62 is also on the insulation layer 46 for a bank. The plurality of pixel electrodes 52 and the counter electrode 62, and the organic electroluminescence layer 54 therebetween constitute a plurality of light emitting element 64. The organic electroluminescence layer 54 is between the pixel electrode 52 and the counter electrode 62 and is configured to emit light with its brightness controlled by a current flowing therebetween.

The counter electrode 62 is made from a transparent conductive film such as indium tin oxide (ITO). The light generated in the light emitting element 64 passes through the counter electrode 62, while reflected on the light reflective layer 44 included in the underlying electrode 40. Since the light reflective layer 44 has its edge under the insulation layer 46, the light passing through the insulation layer 46 is reflected on the underlying electrode 40 (light reflective layer 44), thus improving light utilization efficiency.

On the counter electrode 62 is a sealing film 66. The plurality of light emitting elements 64 are sealed with the sealing film 66 to be blocked from moisture. The sealing film 66 may include at least one organic film made from a material such as a resin between a pair of inorganic layers made from material such as silicon nitride. The sealing film 66 spreads over the display area DA (FIG. 1). On the sealing film 66 is laminated a counter substrate 70 made from material such as glass, with an adhesive layer 68 interposed therebetween.

Second Embodiment

Figure 4:
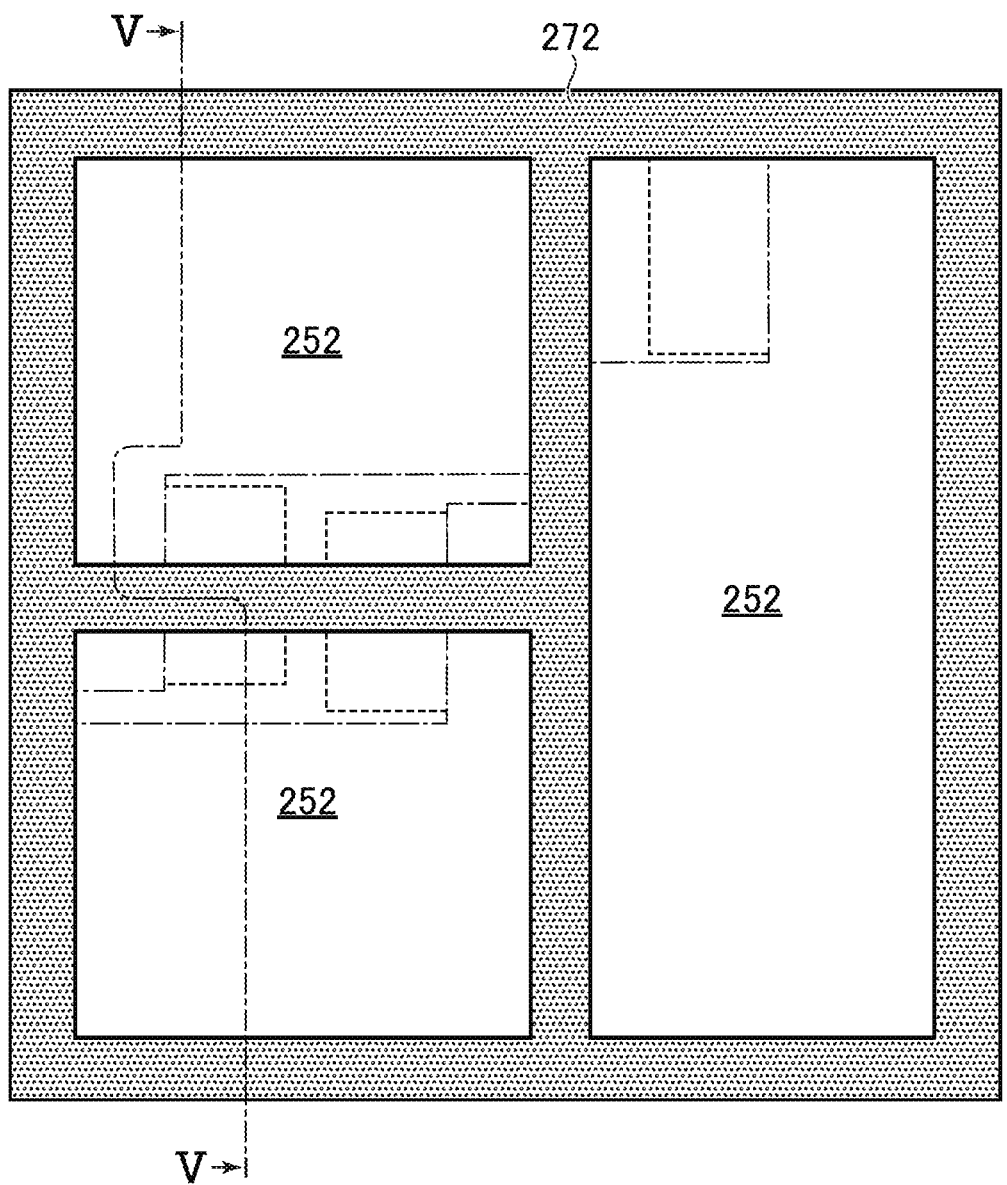
FIG. 4 is an enlarged plan view of a portion of a display device in accordance with a second embodiment.
Figure 5:
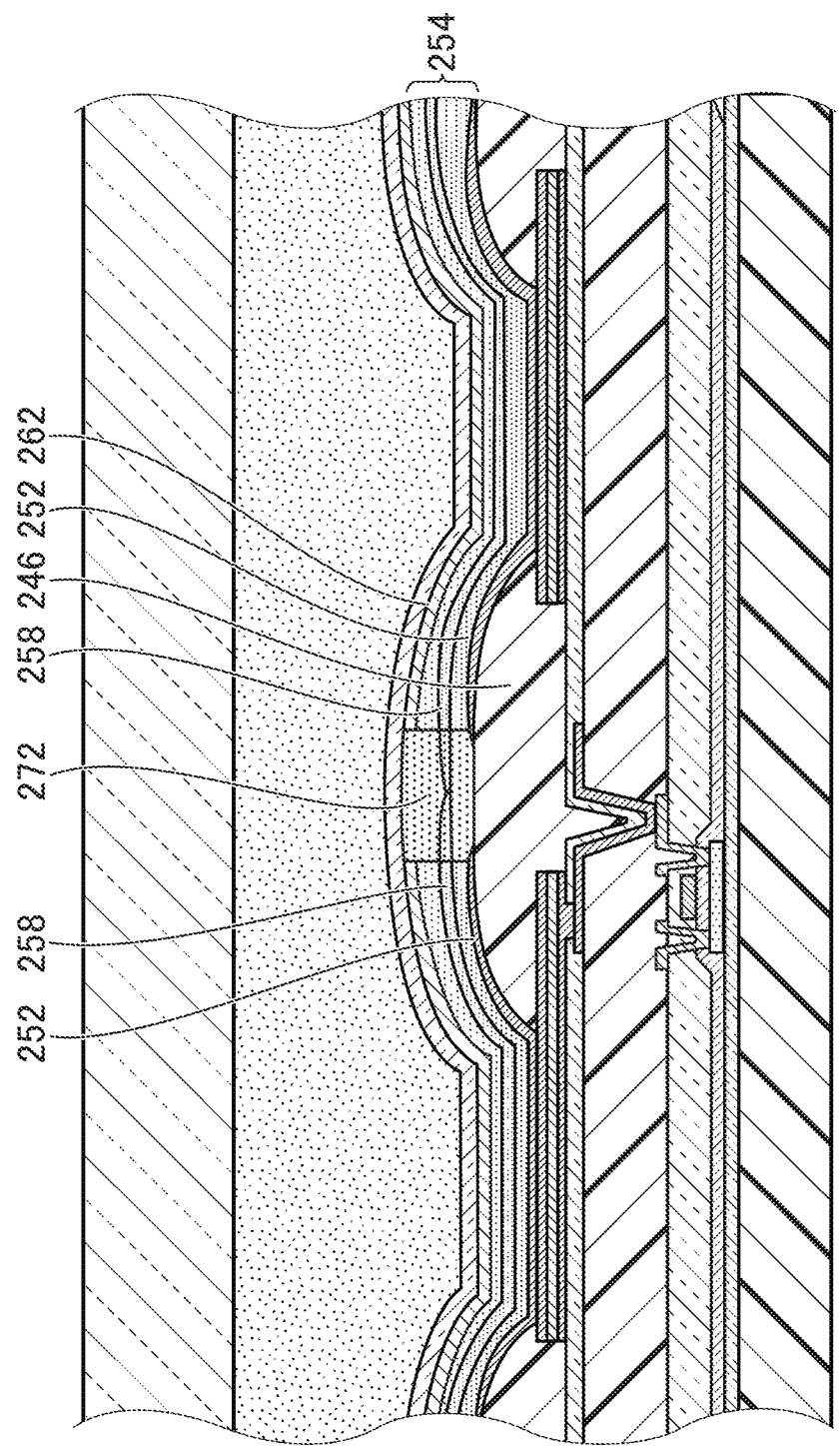
FIG. 5 is an enlarged view of V-V line cross section of the display device in FIG. 4.

FIG. 4 is an enlarged plan view of a portion of a display device in accordance with a second embodiment. FIG. 5 is an enlarged view of V-V line cross section of the display device in FIG. 4. In this embodiment the organic electroluminescence layer 254 has a low conductive portion 272 with lower conductivity than other portions. The low conductive portion 272 is between an adjacent pair of pixel electrodes 252 among the plurality of pixel electrodes 252. The low conductive portion 272 continuously surrounds at least a central portion of each of the plurality of pixel electrodes 252.

The plurality of pixel electrodes 252 fall into some groups for respective colors. The light emitting layer 258 is configured to emit light of a corresponding one of the colors in the groups. The details are explained in the first embodiment. The low conductive portion 272 is between an adjacent pair of pixel electrodes 252 in different groups. The light emitting layer 258, between the adjacent pair of pixel electrodes 252, has a portion included in the low conductive portion 272.

The low conductive portion 272 impedes a flow of carriers (electrons or holes) in a spreading direction of the organic electroluminescence layer 254. The low conductive portion 272, which is on the insulation layer 246, impedes the flow of carriers on the insulation layer 246 and in the spreading direction of the organic electroluminescence layer 254.

According to this embodiment, the organic electroluminescence layer 254 has low conductivity over an area between adjacent pixel electrodes 252, preventing current leakage between adjacent pixels. Any pixel, next to another pixel where a current flows, does not emit light.

The organic electroluminescence layer 254 is formed by vapor deposition or sputtering. Subsequently, the organic electroluminescence layer 254 is irradiated with energy beams such as ultraviolet rays, electron beams, and infrared rays. The energy beams are applied to an area between adjacent pixel electrodes 252. Applying the energy beams makes the organic electroluminescence layer 254 have lower conductivity, thus forming the low conductive portion 272 in the organic electroluminescence layer 254.

Subsequently, a counter electrode 262 is formed on the organic electroluminescence layer 254. The counter electrode 262 is formed after applying the energy beams to the organic electroluminescence layer 254. Applied before forming the counter electrode 262, the energy beams lose less irradiation energy. What is explained in the first embodiment is applicable to this embodiment.

Third Embodiment

Figure 6:
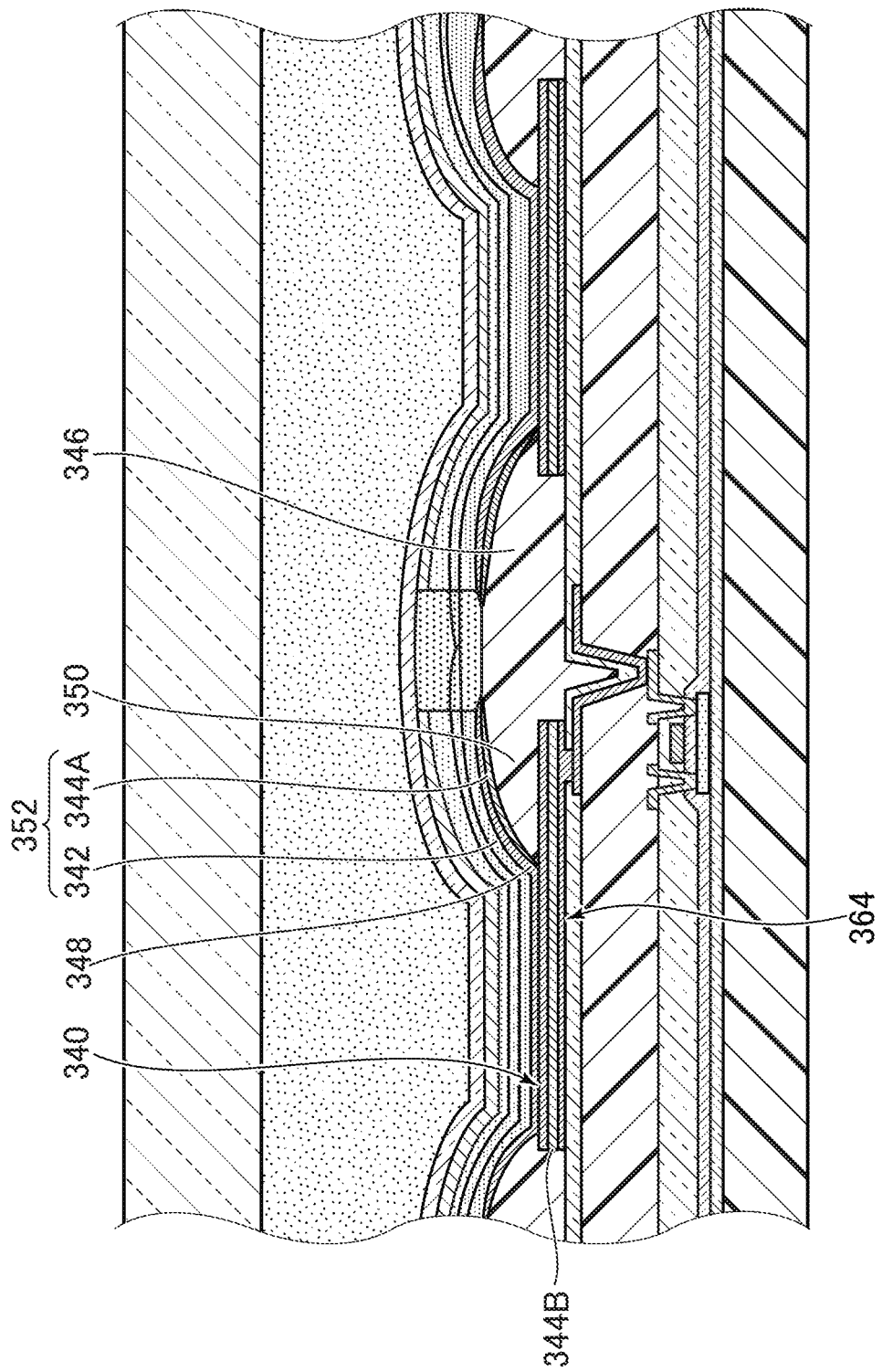
FIG. 6 is a cross sectional view of a display device in accordance with a third embodiment.

FIG. 6 is a cross sectional view of a display device in accordance with a third embodiment. This embodiment is different from the second embodiment in FIG. 5 in that the pixel electrode 352 includes a light reflective layer 344A.

The light reflective layer 344A is on an opening edge 350 without overlapping with an opening 348 of an insulation layer 346. The pixel electrode 352 further includes a transparent conductive layer 342 made from material such as indium tin oxide (ITO). The light reflective layer 344A is under the transparent conductive layer 342; a light emitting element 364 generates light, which passes through the transparent conductive layer 342 and is reflected on the light reflective layer 344A over the insulation layer 346, reducing attenuation of the light because of its reflection without passaging through the insulation layer 346. The transparent conductive layer 342 is connected to the underlying electrode 340 in the opening 348. The underlying electrode 340 also includes a light reflective layer 344B. What is explained in the second embodiment is applicable to this embodiment.

Fourth Embodiment

Figure 7:
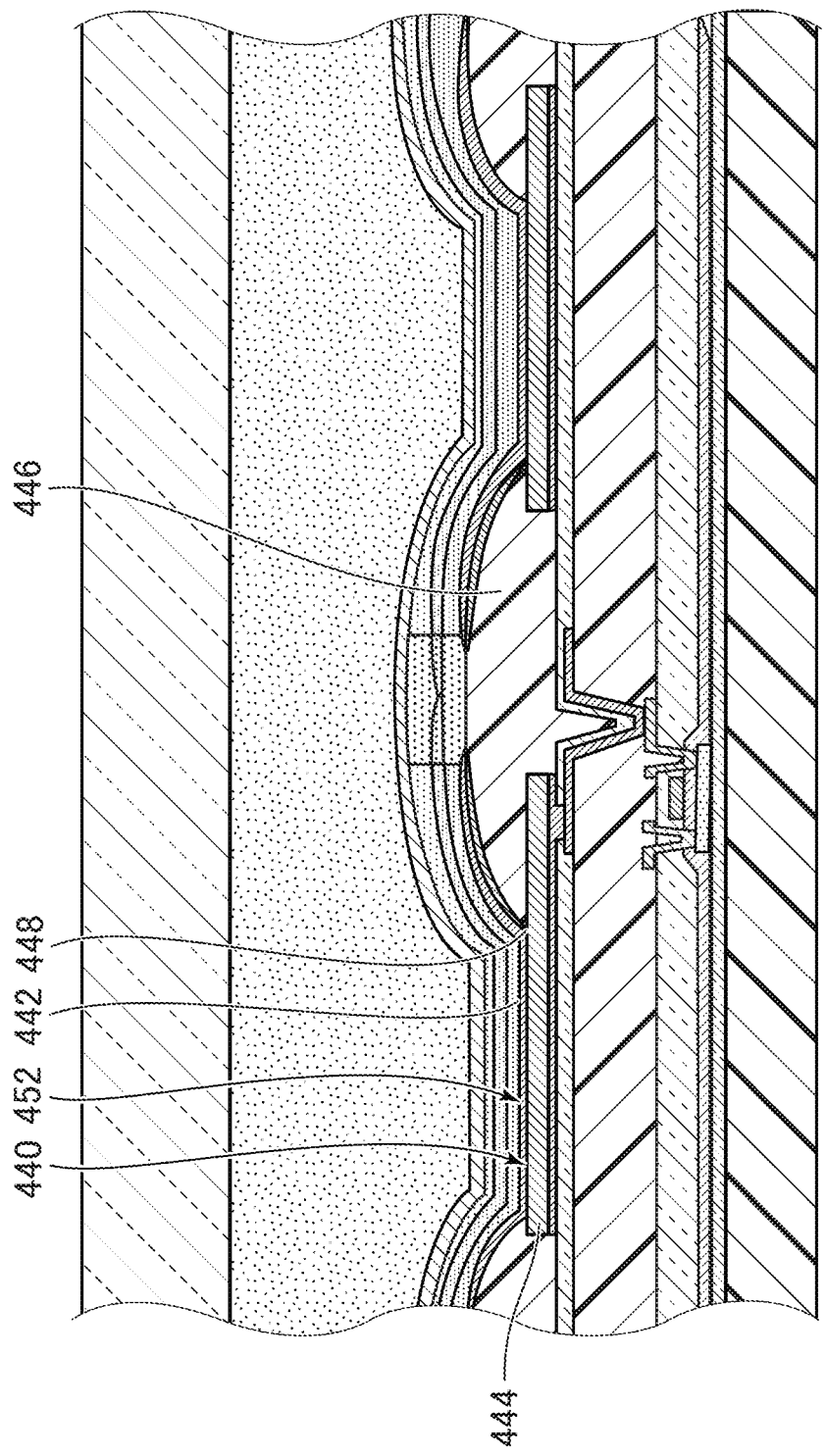
FIG. 7 is a cross sectional view of a display device in accordance with a fourth embodiment.

FIG. 7 is a cross sectional view of a display device in accordance with a fourth embodiment. This embodiment is different from the third embodiment in FIG. 6 in that the underlying electrode 440 at its top layer includes a light reflective layer 444. The pixel electrode 452 includes a transparent conductive layer 442, which is connected to the light reflective layer 444 of underlying electrode 440 in the opening 448 of the insulation layer 446. What is explained in the third embodiment is applicable to this embodiment.

Fifth Embodiment

Figure 8:
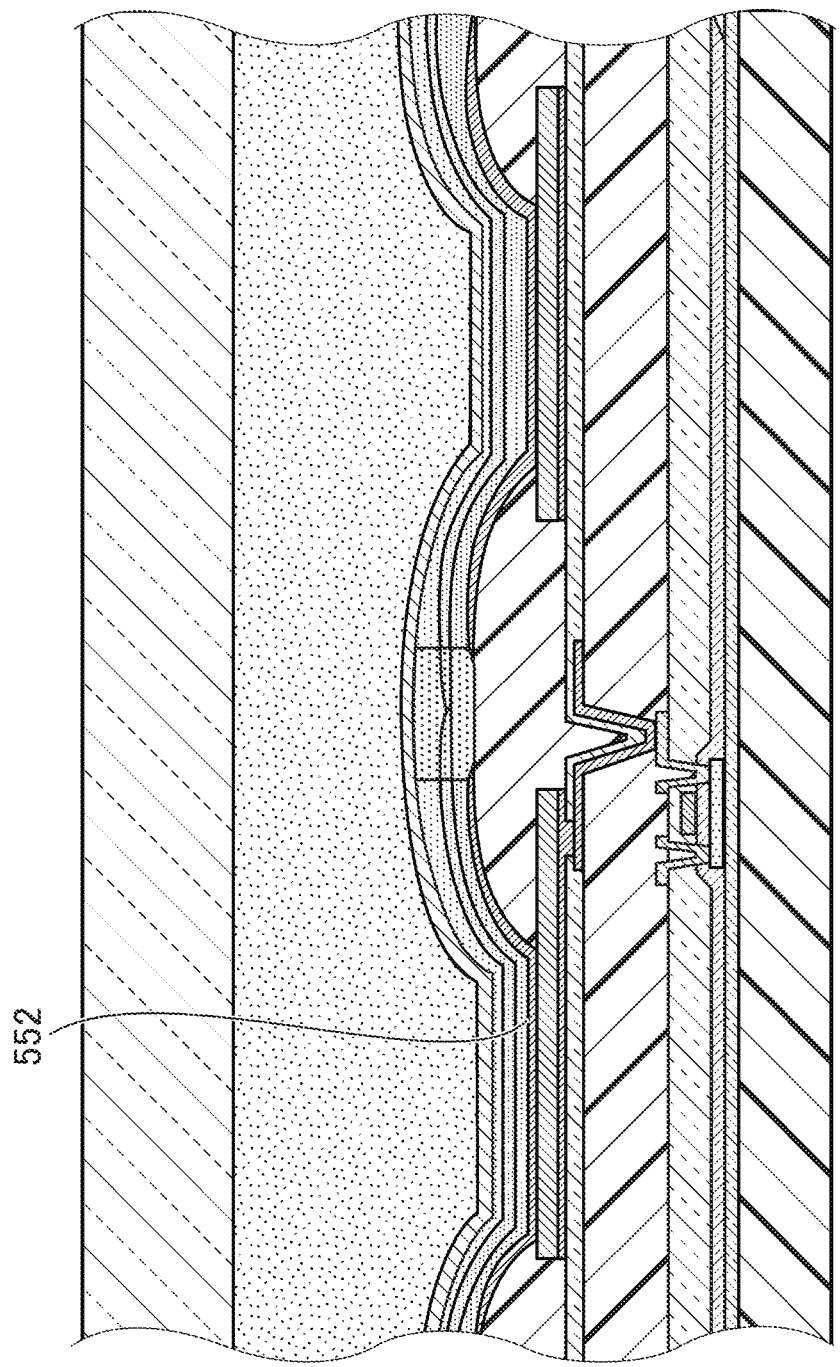
FIG. 8 is a cross sectional view of a display device in accordance with a fifth embodiment.

FIG. 8 is a cross sectional view of a display device in accordance with a fifth embodiment. This embodiment is different from the fourth embodiment in FIG. 7 in that the pixel electrode 552 includes no light reflective layer. What is explained in the fourth embodiment is applicable to this embodiment.

Sixth Embodiment

Figure 9:
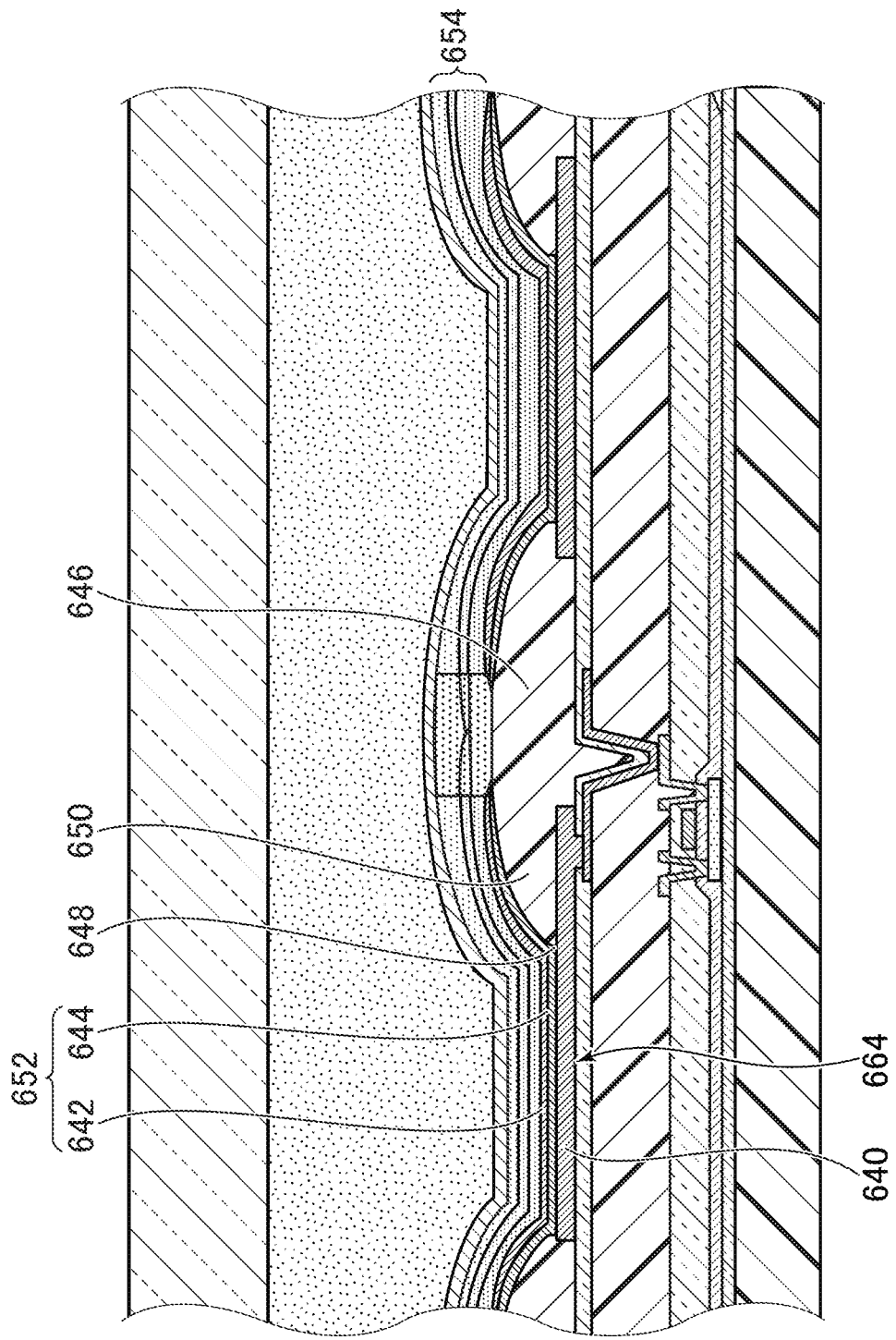
FIG. 9 is a cross sectional view of a display device in accordance with a sixth embodiment.

FIG. 9 is a cross sectional view of a display device in accordance with a sixth embodiment. In this embodiment the underlying electrode 640 has no light reflective layer. The underlying electrode 640 is entirely made from a transparent conductive film such as indium tin oxide (ITO). The pixel electrode 652 includes a transparent conductive layer 642 at its top layer in contact with the organic electroluminescence layer 654; the pixel electrode 652 includes a light reflective layer 644 in a layer except for the top layer. The light reflective layer 644 extends from an opening 648 of the insulation layer 646 to an opening edge 650, enabling the light generated in the light emitting element 664 to be reflected on pixel electrode 652 (light reflective layer 644). What is explained in the second embodiment is applicable to this embodiment.

Seventh Embodiment

FIG. 10 is an enlarged plan view of a portion of a display device in accordance with a seventh embodiment. This embodiment is different from the first embodiment in FIG. 2 in arrangement of the unit pixels (subpixels). In this embodiment the red subpixel R, the green subpixel G, and the blue subpixel B are equivalent in size. The same color subpixels are arranged in the first direction D1 (longitudinal direction in FIG. 10) and the different color subpixels are arranged in the second direction D2 (lateral direction in FIG. 2). What is explained in the first embodiment is applicable to this embodiment.

Eighth Embodiment

FIG. 11 is an enlarged plan view of a portion of a display device in accordance with an eighth embodiment. This embodiment is different from the seventh embodiment in FIG. 10 in that the organic electroluminescence layer has a low conductive portion 872. What is explained in the second embodiment is applicable to the low conductive portion 872.

The plurality of pixel electrodes 852 fall into some groups for respective colors. The light emitting layers are configured to emit light of the respective colors in the groups. The low conductive portion 872 is between an adjacent pair of pixel electrode 852 included in different groups. What is explained in the seventh embodiment is applicable to this embodiment.

Ninth Embodiment

Figure 12:
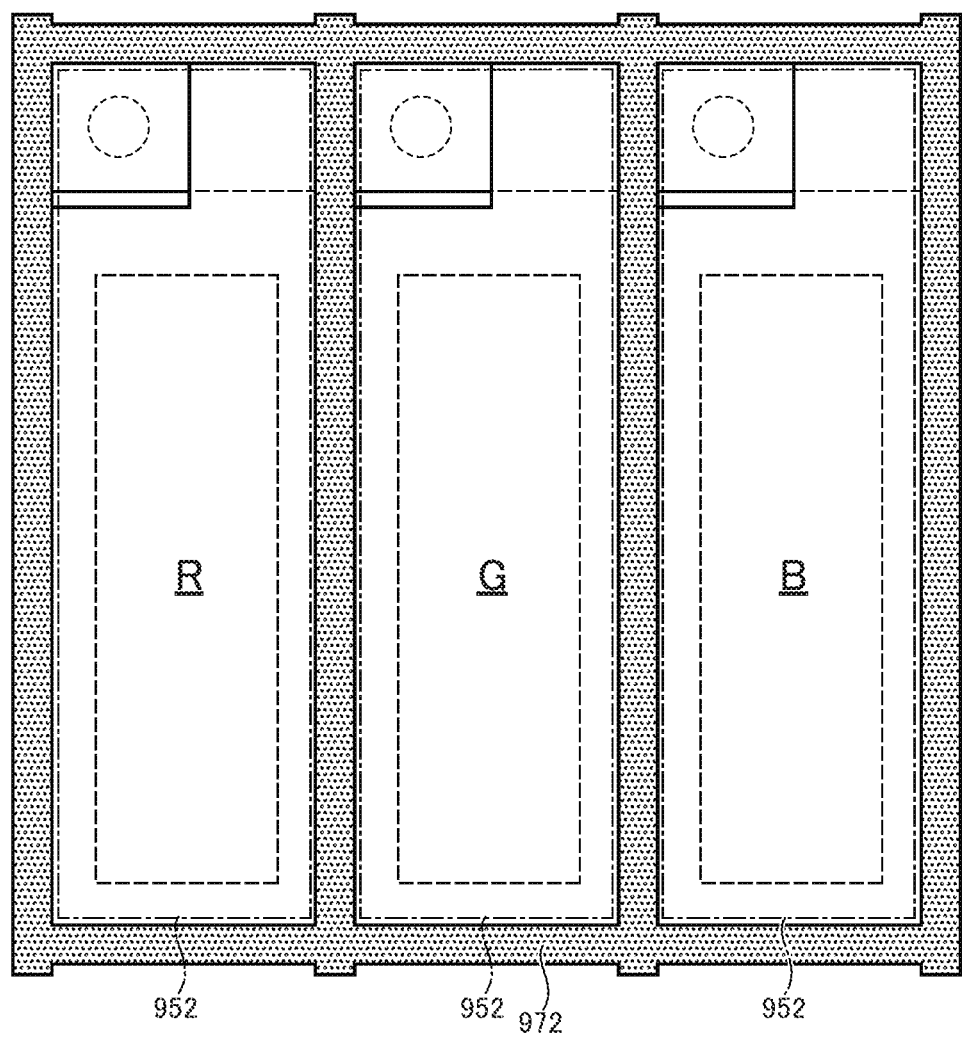
FIG. 12 is an enlarged plan view of a portion of a display device in accordance with a ninth embodiment.

FIG. 12 is an enlarged plan view of a portion of a display device in accordance with a ninth embodiment. This embodiment is different from the eighth embodiment in FIG. 11 in that the low conductive portion 972 continuously surrounds at least a central portion of each pixel electrode 952. What is explained in the eighth embodiment is applicable to this embodiment.

The display device is not limited to the organic electroluminescence display device but may be a display device with a light-emitting element disposed in each pixel, such as a quantum-dot light-emitting diode (QLED).

While there have been described what are at present considered to be certain embodiments, it will be understood that various modifications may be made thereto, and it is intended that the appended claims cover all such modifications as fall within the true spirit and scope of the invention.

What is claimed is:

1. A display device comprising:
an insulation layer having a plurality of openings, the insulation layer having a plurality of opening edges around the respective openings;
a plurality of pixel electrodes in the respective openings and on the respective opening edges;
an electroluminescence layer continuously on the plurality of pixel electrodes, the electroluminescence layer consisting of some layers including a bottom layer thereof, the electroluminescence layer including a light emitting layer in one of the layers except for at least the bottom layer, the light emitting layer overlapping with a corresponding one of the pixel electrodes;
a counter electrode on the electroluminescence layer; and
a plurality of underlying electrodes under the respective pixel electrodes and the insulation layer, wherein
the plurality of underlying electrodes are connected to the respective pixel electrodes in the respective openings, and
each of the plurality of opening edges of the insulation layer is interposed between a periphery of a corresponding one of the underlying electrodes and a periphery of a corresponding one of the pixel electrodes.

2. The display device according to claim 1, wherein the plurality of underlying electrodes have a thickness greater than the plurality of pixel electrodes.

3. The display device according to claim 1, wherein at least one of each of the plurality of pixel electrodes and each of the plurality of underlying electrodes includes a light reflective layer.

4. The display device according to claim 3, wherein
each of the plurality of underlying electrodes includes the light reflective layer, and
none of the plurality of pixel electrodes includes the light reflective layer.

5. The display device according to claim 3, wherein
each of the plurality of underlying electrodes includes the light reflective layer, and
each of the plurality of pixel electrodes includes the light reflective layer so as not to overlap with a corresponding one of the openings.

6. The display device according to claim 1, wherein
the periphery of each of the plurality of pixel electrodes has a less thickness at a position closer to a tip thereof.

7. The display device according to claim 1, wherein the bottom layer of the electroluminescence layer is a carrier injection transport layer continuously on the plurality of pixel electrodes.

8. The display device according to claim 1, wherein the light emitting layer protrudes from a corresponding one of the pixel electrodes.

9. The display device according to claim 1, wherein the light emitting layer is each of light emitting layers disposed to be separated from one another in response to the respective pixel electrodes.

10. The display device according to claim 9, wherein an adjacent pair of the light emitting layers have end portions overlapping with each other.

11. A display device comprising:
- an insulation layer having a plurality of openings, the insulation layer having a plurality of opening edges around the respective openings;
- a plurality of pixel electrodes in the respective openings and on the respective opening edges;
- an electroluminescence layer continuously on the plurality of pixel electrodes, the electroluminescence layer consisting of some layers including a bottom layer thereof, the electroluminescence layer including a light emitting layer in one of the layers except for at least the bottom layer, the light emitting layer overlapping with a corresponding one of the pixel electrodes; and
- a counter electrode on the electroluminescence layer,
- wherein the electroluminescence layer has a low conductive portion, with lower conductivity than other portions, between an adjacent pair of the pixel electrodes.

12. The display device according to claim 11, wherein the light emitting layer has a portion, which is included in the low conductive portion, between the adjacent pair of the pixel electrodes.

13. The display device according to claim 11, wherein the low conductive portion continuously surrounds at least a central portion of each of the plurality of pixel electrodes.

14. The display device according to claim 11, wherein
- the plurality of pixel electrodes fall into some groups in response to respective colors,
- the light emitting layer is configured to emit light in a corresponding one of the colors in response to the respective groups, and
- the low conductive portion is between an adjacent pair of the pixel electrodes included in different two of the groups.

* * * * *